United States Patent [19]

Dhaka

[11] 3,923,562

[45] Dec. 2, 1975

[54] PROCESS FOR PRODUCING MONOLITHIC CIRCUITS

[75] Inventor: Vir A. Dhaka, Poughkeepsie, N.Y.

[73] Assignee: International Business Machines Corporation, Armonk, N.Y.

[22] Filed: June 24, 1971

[21] Appl. No.: 156,504

Related U.S. Application Data

[63] Continuation of Ser. No. 765,574, Oct. 7, 1968, abandoned.

[52] U.S. Cl. .................... 148/187; 148/189

[51] Int. Cl.$^2$ .................... H01L 21/223

[58] Field of Search .................... 148/187

[56] References Cited

UNITED STATES PATENTS

| | | | |
|---|---|---|---|
| 3,107,188 | 10/1963 | Hancock | 156/17 |
| 3,309,245 | 3/1967 | Haenichen | 148/187 |
| 3,334,281 | 7/1964 | Ditrick | 148/187 |
| 3,342,650 | 9/1967 | Seki et al. | 148/187 |
| 3,408,238 | 10/1968 | Sanders | 148/187 |
| 3,437,533 | 4/1969 | Dingwall | 148/187 |
| 3,477,886 | 11/1969 | Ehlenberger | 148/187 |
| 3,479,237 | 11/1969 | Bergh | 148/187 |
| 3,484,313 | 12/1969 | Tauchi | 148/187 |
| 3,497,407 | 2/1970 | Esch | 156/17 |
| 3,510,369 | 5/1970 | Ernick | 148/187 |
| 3,575,745 | 4/1971 | Hill | 148/187 |
| 3,576,685 | 4/1971 | Swann | 148/187 |

*Primary Examiner*—L. Dewayne Rutledge
*Assistant Examiner*—J. M. Davis
*Attorney, Agent, or Firm*—David M. Bunnell

[57] ABSTRACT

A technique of fabricating semiconductor devices so as to avoid mask alignment difficulties when it is required that electrical contact be made subsequent to the formation of extremely small device regions. The diffusion mask for creating the small device regions is constituted of a first film which is subject to ready etching by a first etchant but which is substantially unaffected by a second etchant. A second film covers the opening in the device region formation. This film being subject to etching by the second etchant but being substantially unaffected by the first etchant. As a result, the second film is removed from within the opening without affecting the first film since the first film will resist the second etchant. Thus, the original opening is re-established for the purpose of making contact to the device region, the first film remaining as a passivating film on the substrate.

7 Claims, 9 Drawing Figures

INVENTOR.
VIR A. DHAKA
BY
John F. Ahlandt Jr.
ATTORNEY

PROCESS FOR PRODUCING MONOLITHIC CIRCUITS

CROSS-REFERENCE TO RELATED APPLICATION

This application is a continuation of application Ser. No. 765,574 filed Oct. 17, 1968 and now abandoned.

BACKGROUND, OBJECTS & SUMMARY OF THE INVENTION

This invention relates generally to the fabrication of semiconductor devices, especially to those that are fabricated by means of integrated circuit technology. The invention is especially concerned with an improvement in the technique of forming transistors and like devices, which have extremely narrow emitter regions or comparable regions in their constitution. As an example of the dimensions of interest, the emitter widths of such transistors are of the order of 0.1 mils or less.

For an appreciation of the problems which the present invention is designed to surmount, some background information is considered desirable with respect to the basic aspects of integrated circuit technology. Although such background information is supplied, it will be understood that the present invention is not limited only to situations where vast arrays of semiconductor circuits and the like are integrally formed and retained as such, but the invention also applies to cases where great numbers of devices are fabricated simultaneously within the same wafer or substrate but are subsequently separated and processed as individual units.

From the above discussion it will be appreciated that the term "integrated circuits" encompasses a wide varity of techniques and forms. Whatever specific technique is employed, it may be stated that, generally speaking, active and passive devices, or other required components are embedded within the wafer by diffusion operations which can be exploited to producing varying depths of penetration of impurities within the monolith, thereby to create the desired regions defining the devices or other components.

With specific reference to the formation of transistor devices within a wafer or monolith, the terms "planar" or "planar structure" have often been applied to such formation. In the formation of a planar structure conventional photolithography techniques are applied to an insulative coated surface of the wafer to create diffusion masking patterns for producing the typical transistor device. In the case of silicon, which is the most common semiconductor used today, a genetic oxide is usually formed at the surface, namely $SiO_2$. A sequence of appropriate diffusion steps is performed for creating the required regions within the wafer. Thus, selective diffusions through openings in the usual oxide coating are carried out to produce the base, emitter, and sometimes the collector, regions of the transistor.

In addition to the formation of the needed regions for selected devices that are to be produced within the wafer, it is necessary to make electrical contact to the regions. Consequently, it becomes necessary very accurately to control the positioning of the successive masks that are used respectively for producing the device regions and for subsequently producing the limited area openings which enable reaching down by means of metal conductors to make electrical contact to those device regions. The difficulties become severe as the number of these masking steps is increased, it being understood that successive masking operations require accurate alignment of photographic masks that define the selected areas to be opened in photoresist material, such procedure being part and parcel of diffusion mask fabrication techniques.

The mask alignment difficulties can be appreciated from the fact that, in the preparation of ultra high frequency transistors, what are to be created are extremely narrow emitter regions having widths, as have been indicated before, of 0.1 mils or less. Therefore, it is necessary to align the required masks with an accuracy of from 2 to 3 microns. Otherwise "shorting out" and other related problems are encountered, with the result that the yield of satisfactory transistors is substantially diminished.

It should be noted that not only is the yield improved by the technique of the present invention but, since the number of masks is reduced, the costs are very much lowered, the masks themselves being quite expensive. Also, the total time normally involved in mask alignment is decreased.

A further difficulty that is encountered in ultra high frequency transistor fabrication in the planer configuration is that the devices must be thoroughly passivated. The problem stems from the fact that the PN junctions, such as the emitter or collector junction, emerge at the surface of the wafer. Unless the junctions so formed are thoroughly overlaid and protected, they will be a source of difficulty in the final operation of devices.

Although it has been known to protect PN junctions by the deposition of a nitride of silicon, for example, $Si_3N_4$, it is a fundamental object of the present invention to exploit the passivation capabilities of such material, and while effecting this purpose, afford a unique solution to the previously described problem with respect to mask aligning operations.

Briefly stated, a broad feature of the present invention resides in a method or technique which, following the usual diffusion step for producing the base region or comparable region of a device, comprises forming, at the surface of a semiconductor substrate, a passivating film, preferably of silicon nitride ($Si_3N_4$). This first film is effective to shield against penetration of impurities and, therefore, can act alone, or in conjunction with another film, to serve as a diffusion mask for purposes to be explained. Moreover, this first film resists etching by one selected etchant, while being readily etched by another selected etchant. Accordingly, it is capable of preventing undesired etching, of limiting etching to pre-determined areas.

In accordance with a preferred embodiment of the technique referred to, two successive insulating films are formed at the substrate surface in achieving the required diffusion mask for the purpose, for example, of defining an emitter region. Thus, another insulating film, preferably of $SiO_2$, is initially deposited on the surface of the semiconductor substrate. It is generally preferred to provide this underlayer of $SiO_2$ because of the "surface states" which normally attend the fabrication of a diffusion mask at the substrate surface.

In accordance with further, more specific aspects of the present invention, the initially deposited insulating film of $SiO_2$ is formed so as to be completely continuous; that is it is not provided, prior to forming the first or passivating film, with any openings or holes extending to the surface of the substrate. The passivating film of $Si_3N_4$ is then formed so as to completely overlay the continuous film of $SiO_2$. This latter film fulfills the purpose of thoroughly passivating the emergent junctions of the semiconductor devices. Moreover, as indicated previously the film of $Si_3N_4$ is able to serve as an etch-resist; that is, it prevents undesired etching. In particular, it acts to prevent unwanted enlarging of the diffusion opening extending to the semiconductor substrate surface.

The significant result of this etch resistant function is that it enables the avoidance of the mask alignment difficulties that are presented by the need, for example, to form a very small opening for emitter diffusion and, thereafter, to make electrical contact to that emitter. Thus, the very opening that is used for the emitter diffusion operation is made available, or is re-established, for the purpose of making contact to the emitter. The dimensions of this opening are substantially unchanged because of the etch resist capability of the first film of $Si_3N_4$.

The above-noted ability of the passivating film to act as an etch resist derives from the fact that, in accordance with a specific feature of the present invention, two materials subject to etching by distinct etchants are utilized. Thus, for the example given, that is, where the preferred first film is constituted of $Si_3N_4$, an etchant which is suitable for attacking the silicon nitride is used, namely, monobasic ammonium phosphate ($NH_4H_2PO_4$). However, the monobasic ammonium phosphate, is totally ineffective to etch the $SiO_2$. Conversely, for the purpose of etching the $SiO_2$ a conventional and well-known etchant such as a buffer etch is utilized, this etchant being substantially ineffective to etch the film of silicon nitride.

With reference to the fabrication of a transistor, once the base diffusion operation has been performed and the film or films as described above have been formed at the surface of the substrate, the further steps according to the method of the present invention are carried out. These comprise: forming an opening of such lateral extent as to permit the diffusion of suitable impurity into the surface of the substrate to create the desired emitter region. This opening, which eventually extends down to the surface, is produced, in the instance of two films having been formed to define the diffusion mask, by successive application of the particular etchants to their respective films. Once this opening has been established, selective diffusion of an active impurity into the semiconductor substrate is carried out. Then, a second film, chiefly constituted of $SiO_2$, is formed within the already established opening. This film is produced as a consequence of the diffusion operation and/or exposure to oxidizing ambients, and is effectively turned to the purpose of preserving the opening for later use. In other words, where the processing calls for forming another opening in order to permit metallization contact with the base region, such operation can be performed while the second film remains over the emitter. Thereafter, this film of $SiO_2$ disposed over the emitter is removed by using "dip-open" techniques; that is, techniques not requiring further photoresist application. Thus, the substrate is merely immersed in the conventional etchant, which is adapted to remove $SiO_2$ which will not affect the $Si_3N_4$ film.

It will, therefore, be apparent that the aforedescribed technique of the present invention provides the advantage of permitting only the second film to be removed, thereby re-establishing the emitter diffusion opening for the subsequent purpose of making contact to the emitter. Thus, an opening of the same dimensions, of the same lateral extent, is made available and is re-established, so that the metallization can make contact. The need for alignment of successive photo-masking patterns is completely eliminated. At the same time, there is left at the surface a heavy duty film of $Si_3N_4$ for passivation purposes.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIGS. 1A–1J illustrate a series of section views in accordance with the several steps of a preferred embodiment of this invention.

DESCRIPTION OF PREFERRED EMBODIMENT

Figure 1A:
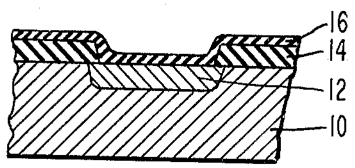

Referring now to FIGS. 1A–1J, the technique of the present invention is illustrated by a series of sectional views of a portion of a semiconductor wafer. Thus, for the sake of simplicity, there is represented a typical device site in a portion 10 of a wafer in which there has been formed a multiplicity of similar device. There is shown a base region 12 of a typical transistor which has been produced by the application of photolithography procedures to the upper surface of the wafer which has been coated with an insulative coating 14 for this purpose.

As will now be manifest, the significant aspect or feature resides in the fact that, following the normal formation of the typical region 12, a continuous film or layer of $Si_3N_4$ is formed. This film will constitute at least part of the required diffusion mask for the emitter fabrication and will serve as a means for avoiding the mask alignment problem already alluded to. However, in order to overcome the "surface states" phenomenon a preferred technique is to deposit in the first instance a film of $SiO_2$.

Thus, in accordance with the preferred technique, the following steps are performed after the base diffusion has been completed. The film 16, comprising $SiO_2$, is deposited so as to completely overlay the original coating 14. The thickness of this layer 16 is chosen to be of the order of 100–1000A. The layer 16 is preferably produced by pyrolytic deposition from a suitable source, the source temperature being of the order of 300°–500°C and the deposition of substrate temperature being of the order of 380°–500°C. Alternatively, in this step, the required $SiO_2$ layer could be achieved by oxidation of the surface of the substrate, which is a well-known procedure.

Figure 1B:
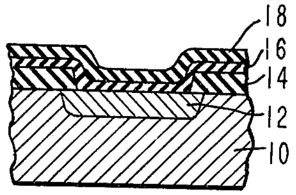

As indicated in FIG. 1B, the film 18 is continuously and completely formed over the surface of the film 16. The film 18 is constituted of $Si_3N_4$ and the formation of this film may be achieved by the deposition from the vapor phase of such nitride to a thickness of approximately 500–2500A. A mixture of substantially pure nitrogen is bubbled through silicon tetrachloride and is caused to impinge on the heated semiconductor substrate where the nitride is deposited by thermo-decomposition.

Figure 1C:
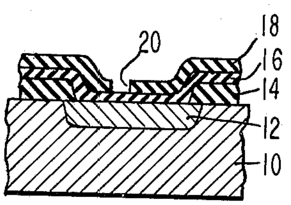

Thereafter, conventional photolithography techniques are applied to the upper surface of the film 18 in order to produce the requisite diffusion opening down to the substrate surface. As is well-known, a photoresist pattern is developed, overlaying film 18, with selected openings therein such that an appropriate etchant which will attack the underlying film is enabled to perform its function. In this instance where $Si_3N_4$ is the material of which the film 18 is constituted the etchant used is monobasic ammonium phosphate ($NH_4H_2PO_4$). In the illustration provided of the formation of a transistor this results in the etchant producing the opening 20 in the film 18. This etchant of course is ineffective to attack the underlying layer 16 of $SiO_2$. Thus, for the moment, as depicted in FIG. 1C, the opening will only extend down to the top surface of layer 16.

As an alternative procedure for creating the opening 20, the photo-resist, rather than being applied to the layer 18 of $Si_3N_4$, could be formed over a further film or layer (not illustrated) disposed so as to overlay film 18. For example, yet another layer of $SiO_2$ could be situated above the film 18 for this purpose and photolithography techniques applied to it.

Figure 1D:
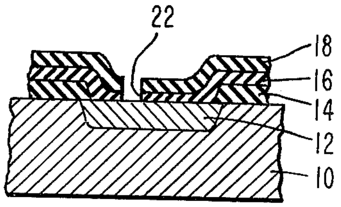
Figure 1E:
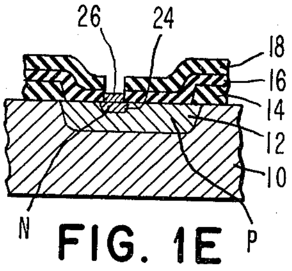

Having formed the typical opening 20, it is still required to reach the surface of the substrate. This is done simply by immersing the entire wafer in a conventional etchant such as a buffer solution of hydrofluoric acid and ammonium fluoride, which will selectively attack the exposed areas of the film 16 of $SiO_2$. Consequently, the opening 22 is produced in film 16 and, in effect, the opening 20 has been further extended downwardly by the action of this second etchant so that the opening reaches the surface of the substrate, as depicted in FIG. 1D.

It should be especially noted at this state of the processing, that is, just before the diffusion step is to be carried out to create the desired emitter region, it has been required that only one photo-resist pattern be developed in order to form the opening for such diffusion.

After the opening has reached the surface of the substrate, a diffusion operation is performed. In the case where the base region 12 is of p conductivity-type, the emitter region 24 is formed so as to be n conductivity-type. This is done in a conventional manner by the diffusion of an active impurity such as phosphorous or arsenic, an n-type impurity, which is introduced from the vapor phase through the openings 20 and 22 and into the wafer surface. The diffusion of the impurity is usually carried out in an oxidizing atmosphere. As a consequence, there is produced at the silicon substrate, within the opening 22, a thin film 26, chiefly $SiO_2$. This film has a thickness of approximately 50–80A.

In the particular instance of the fabrication of a transistor-like device, it is necessary to make contact to the base region. In other words, under normal circumstances, the base contact formation would follow the diffusion of the emitter region 24. In order to effectuate this base contact and not interfere with the already-formed emitter, an additional layer of photo-resist is applied (not shown). This photo-resist layer is disposed over the upper surface of the structure illustrated in FIG. 1E.

Figure 1F:
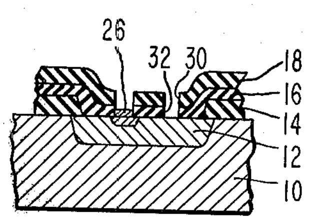
Figure 1G:
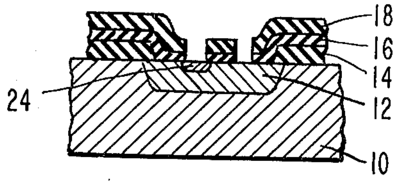

While the opening 22 is masked by photo-resist, the steps for forming the base contact opening are performed. These steps, the result of which is shown in FIG. 1F, follow the procedure already described in creating the emitter diffusion openings 20 and 22. Thus, in the same fashion, the two etchants are used for selectively attacking their respective films 18 and 16, and the openings 30 and 32 are formed so as to reach the substrate surface at the appropriate area.

It will be apparent that during this operation the emitter is completely protected because of the presence of the photo-resist layer. However, when the required opening for the base contact has been formed in the films 18 and 16, the conventional etchant (buffer etch) is used to attack the thin film 26 of $SiO_2$. Consequently, such material as is present in the openings 20 and 22 is removed immediately prior to metallization. Thereby, the very same openings that were utilized in diffusing the emitter region are re-established, as can be appreciated by reference to FIG. 1G.

Figure 1H:
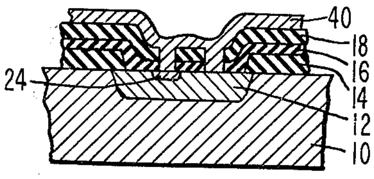

Following removal of all of the $SiO_2$ from the openings, a conventional step of providing metallization at the surface is performed. The entire surface is coated with a suitable metal layer 40 such as of aluminum, and this metal penetrates through the openings to reach the substrate surface, as seen in FIG. 1H. Using a substractive etch procedure involving photo-resist techniques, only the metal that is required for making the individual contacts to the emitter and base regions is left at the surface. The subtractive etch procedure is illustrated in FIG. 1J.

Alternatively, metallurgical systems, other than aluminum, can be used without affecting the principles of the present invention. For example, the ohmic contact contacting the semiconductor element can be platinum silicide, palladium silicide, or molybdenum. Second, third and even higher levels of metallurgies can then be formed over the first contact. Typically chromium-silver-chromium or titanium-silver-chromium could be used for these higher level metallurgies.

Figure 1J:
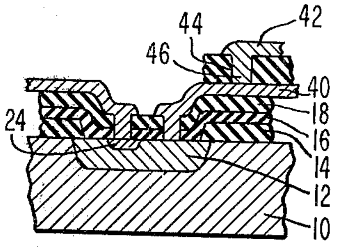

A further advantage of the technique of the present invention can be appreciated by referring to the upper right hand portion of FIG. 1J where there is depicted, in fragmentary form, a multiple-level metallurgical arrangement. The metal layer 40 is connected to another metal layer 42 at a higher level by virtue of metal disposed in the "via" hole 44 which is formed in the conventional insulative layer 46. The layer 46 is typically constituted of sputtered $SiO_2$. In this arrangement, the presence of the film 18 of $Si_3H_4$ provides insurance against "shorting" to the substrate in the event that the metal layer 40 has developed pinholes or other imperfections that would permit the etchant normally used in creating the "via" hole to penetrate further down. The film 18 constitutes a barrier for preventing such an occurrence.

While there have been shown and described and pointed out the fundamental novel features of the invention as applied to the preferred embodiment, it will be understood that various omissions and substitutions and changes in the form and details of the device illustrated and in its operations may be made by those skilled in the art without departing from the spirit of the invention. It is the intention, therefore, to be limited only as indicated by the scope of the following claims.

What is claimed is:

1. A method of fabricating devices in a semiconductor substrate, comprising the steps of:

a. forming a base region in the upper surface of said substrate;

b. forming a diffusion mask at the upper surface of said semiconductor substrate, said mask comprising a first film of a first material, and a second film of a second material, the first film overlaying the second;

c. forming an opening through said films to expose a selected portion of said substrate by etching through said first film using a first etchant which is a ready etchant for said first film but which does not substantially affect said second film and then etching through said second film using a second etchant which is a ready etchant for said second film but which does not substantially affect said first film;

d. selectively diffusing an active impurity into said semiconductor substrate through said opening in the films so as to form an emitter region;

e. forming on the exposed portion of said substrate a layer of said second material to close said opening;

f. forming another opening through said mask at a location spaced from the first opening, thereby enabling electrical contact to be made to said base region; and g. re-establishing the first opening by etching said layer of said second material using said second etchant, the first film of first material, which overlays said second film, being resistant to said second etchant, thereby acting to prevent etching of said second film, said first film remaining on said substrate as a passivating film.

2. A method as defined in claim 1, in which said substrate is constituted of silicon.

3. A method as defined in claim 2, in which said first film is constituted of silicon nitride, said second film is constituted of $SiO_2$, said first etchant is monobasic ammonium phosphate and said second etchant is a buffer solution of hydrofluoric acid and ammonium-fluoride.

4. A method as defined in claim 1, further including, after step *g*, covering the entire surface over said substrate with metal so as to make contact through said first opening to said emitter region, and to make contact through said other opening to said base region.

5. The process of claim 1 wherein the layer of second material is formed concomitantly with the formation of the emitter region.

6. A method of fabricating devices in a semiconductor substrate, comprising the steps of:

a. forming a diffusion mask at the upper surface of said semiconductor substrate, said mask comprising a first film of a first material, and a second film of a second material, the first film overlaying the second;

b. forming an opening through said films to expose a selected portion of said substrate by etching through said first film using a first etchant which is a ready etchant for said first film, but which does not substantially affect said second film, and then etching through said second film using a second etchant which is a ready etchant for said second film but which does not substantially affect said first film;

c. selectively diffusing an active impurity into said semiconductor substrate through said opening in the films;

d. forming on the exposed portion of said substrate a layer of said second material to close said opening and thereafter;

e. re-establishing said opening by etching said layer of said second material using said second etchant, the first film of first material, which overlays said second film being substantially unaffected by said second etchant, thereby acting to prevent etching of said second film, said first film remaining on said substrate as a passivating film.

7. The process of claim 6 wherein the layer of second material is formed concomitantly with the diffusion of the active impurity.

* * * * *